United States Patent
Chang et al.

[11] Patent Number: 6,114,193
[45] Date of Patent: Sep. 5, 2000

[54] METHOD FOR PREVENTING THE SNAP DOWN EFFECT IN POWER RECTIFIER WITH HIGHER BREAKDOWN VOLTAGE

[75] Inventors: Yen Hui Chang; Kuo Wei Chiang, both of Keelung, Taiwan

[73] Assignee: Vishay Lite-On Power Semicon Corp., Keelung, Taiwan

[21] Appl. No.: 09/072,584

[22] Filed: May 5, 1998

[51] Int. Cl.$^7$ .................................................. H01L 21/332

[52] U.S. Cl. .......................... 438/140; 438/141; 438/133

[58] Field of Search .................................... 438/133, 134, 438/135, 138, 140, 141

[56] References Cited

U.S. PATENT DOCUMENTS 5,432,121  7/1995  Chan et al. ...................... 148/DIG. 41

*Primary Examiner*—Trung Dang
*Attorney, Agent, or Firm*—Rosenberg, Klein & Lee

[57] ABSTRACT

A method for preventing the snap down effect in a power rectifier with higher breakdown voltage comprises the step of forming an isolation layer between the semiconductor substrate and the epitaxy layer. The isolation layer can prevent the dislocation occurred upon the semiconductor substrate from influencing the p-n junction atop. Therefore, the power rectifier manufactured by the method of the present invention can work under a higher breakdown voltage exceeding 450 V with reduced cost.

11 Claims, 1 Drawing Sheet

METHOD FOR PREVENTING THE SNAP DOWN EFFECT IN POWER RECTIFIER WITH HIGHER BREAKDOWN VOLTAGE

FIELD OF THE PRESENT INVENTION

The present invention relates generally to a method for manufacturing a power rectifier, and more particularly, to a method for preventing the snap down effect in power rectifier with higher breakdown voltage.

BACKGROUND OF THE PRESENT INVENTION

Power rectifiers find wide applications in electronic device and power system etc. The design issues of power rectifiers are low turn-on voltage, high switching speed, and high breakdown voltage. The property of high breakdown voltage is especially important in the application of power supply. A power rectifier with a higher breakdown can more probably offer a surge and provide a safer device.

FIG. 1 shows the structure of a conventional power rectifier. The device is formed by epitaxially growing a lightly-doped n type impurity layer 12 over a heavily doped $n^+$ type substrate 10, and then diffusing a heavily-doped $p^+$ impurity layer 14 over the layer 12. The resultant structure is provided with anode electrode and cathode electrode above $p^+$ impurity layer 14 and below $n^+$ type substrate 10, respectively, to form a power rectifier with a p-n junction.

The power rectifier described above should prevent the prematurity of avalanche breakdown to ensure a high breakdown voltage. More specially, the occurrence of a crowded electric field within the depletion region of the power rectifier should be prevented. For examples, the conventional approaches to enhance the breakdown voltage are to provide floating field rings or field plates within the depletion region. The electrical field distribution will be prevented from being crowded by the provision of the field rings or field plates.

However, in the structure shown by FIG. 1, the n type impurity layer 12 is formed on the heavily doped $n^+$ type substrate 10 by epitaxy. Micro defects such as dislocations are probably occurred and propagated from the interface between the substrate 10 and the impurity layer 12. The prior art results in a dislocation occurring between the epitaxy layer and the substrate. The dislocation generally will not cause an avalanche breakdown when a low voltage (e.g. <450 V) is applied to the power rectifier. However, the dislocation originally occurred between the epitaxy layer and the substrate will influence the p-n junction atop as a higher voltage (e.g. >450 V) is applied. The dislocation caused by the high applied-voltage will induce a snap-down problem which decreases the breakdown voltage.

SUMMARY OF THE PRESENT INVENTION

The object of the present invention is to provide a power rectifier with increased breakdown voltage by eliminating the influence of dislocation propagation effect on p-n junction.

To achieve the above object, the present invention provide a power rectifier comprising a substrate with a first conductive type, a epitaxy layer with a first conductive type, an impurity layer with a second conductive type, and an isolation layer between the substrate and the epitaxy layer wherein the isolation layer is functioned to prevent the dislocation from influencing the p-n junction atop.

The various objects and advantages of the present invention will be more readily understood from the following detailed description when read in conjunction with the three appended drawings, in which:

DETAILED DESCRIPTION OF THE PREFERRED EMBODIMENT

Figure 1:
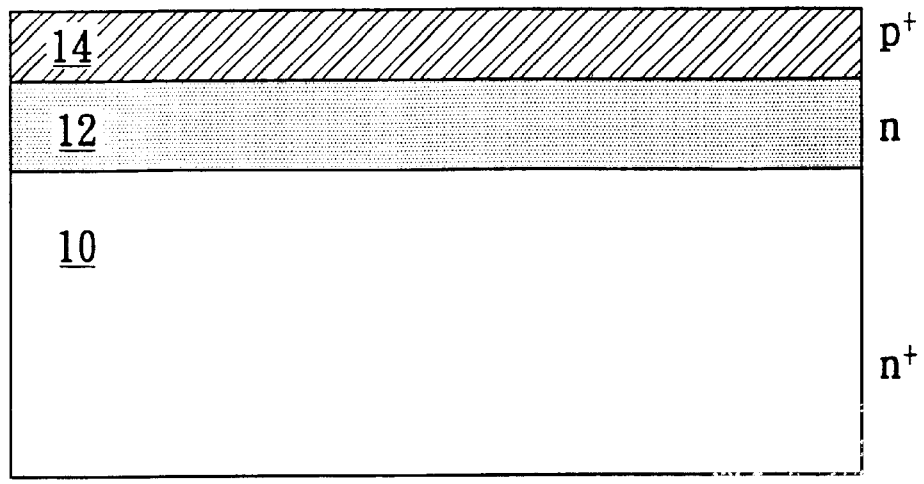
FIG. 1 is the cross section view of a conventional power rectifier.
Figure 2:
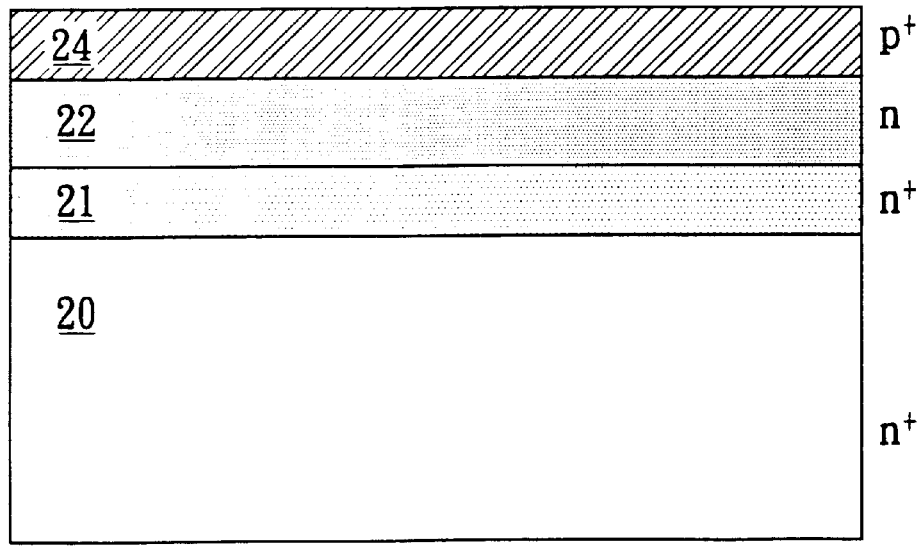
FIG. 2 is the cross section view of the power rectifier according to a preferred embodiment of the present invention.

As shown in FIG. 2, the power rectifier according to a preferred embodiment of the present invention comprises:

an $n^+$ type silicon substrate 20 formed by CZ/FZ/NTD method and with thickness 400±20 $\mu$m and orientation <111>, the substrate 20 being doped with Sb (or As) of concentration $5\times10^{20}\sim1\times10^{19}$ cm$^{-3}$ such that the substrate 20 has resistivity 0.008~0.02 ohm-cm;

an $n^+$ type first epitaxy layer 21 formed epitaxially upon the substrate 20 and with thickness 10 $\mu$m, the $n^+$ type first epitaxy layer 21 being doped with P of concentration $5\times10^{20}\sim1\times10^{19}$ cm$^{-3}$ such that the first epitaxy layer 21 has resistivity 0.01~6 ohm-cm;

an n type second epitaxy layer 22 formed epitaxially upon the first epitaxy layer 21 and with thickness 25~150 $\mu$m, the second epitaxy layer 22 being doped with group V metal (such as P, Sb) having concentration lower than that of the substrate 20 and the first epitaxy layer 21 (e.g. $5\times10^{15}\sim1\times10^{13}$ cm$^{-3}$) such that the second epitaxy layer 22 has resistivity 6~100 ohm-cm;

a p+ type impurity layer 24 formed upon the second epitaxy layer 22 by thermal diffusion and having thickness 10~25 $\mu$m, the impurity layer 24 being doped with group III metal (such as B) having concentration $1\times10^{15}\sim5\times10^{15}$ cm$^{-3}$.

In above-mentioned structure, the n type second epitaxy layer 22 and the p+ type impurity layer 24 can provide the p-n junction for rectification operation and most part of the depletion is provided by the n type second epitaxy layer 22 due to the lower impurity concentration thereof. The $n^+$ type first epitaxy layer 21 located between the $n^+$ type silicon substrate 20 and then type second epitaxy layer 22 is functioned as an isolation layer. The isolation layer can prevent the dislocation from influencing the p-n junction atop.

To verify the effectiveness of above structure, the performance of the power rectifier in according to the present invention is compared with that of a conventional power rectifier by applying a breakdown voltage of 450 V. The conventional power rectifier does not cot comprises the $n^+$ type first epitaxy layer 21 and has the remaining component of the power rectifier according to the present invention. The conventional power rectifier will suffer to a snap down when applied voltage exceeds 450V and applied current 5~100 $\mu$A. As to the power rectifier according to the present invention, it does not suffer to a snap down even though the applied voltage exceeds 450V and the applied current is around several mA.

To sum up, the method provided by the present invention can prevent the power rectifier from suffering a snap down when a high voltage exceeding 450V is applied. Therefore, the power rectifier manufactured by the method of the present invention can work under a higher breakdown voltage with reduced cost.

Although the present invention has been described with reference to the two preferred embodiments thereof, it will be understood that the invention is not limited to the details thereof. Various substitutions and modifications have been suggested in the foregoing description, and other will occur to those of ordinary skill in the art. All such substitutions and modifications are intended to be embraced within the scope of the invention as defined in the appended claims.

We claim:

1. A method of forming a power rectifier having high breakdown voltage comprising the steps of:
    (a) establishing a semiconductor substrate having a predetermined impurity concentration of a first conductivity type;
    (b) forming a semiconductor epitaxial layer to extend over said semiconductor substrate, said semiconductor epitaxial layer having a predetermined impurity concentration of said first conductivity type;
    (c) forming by a thermal diffusion process a semiconductor diffused layer to extend over said semiconductor epitaxial layer, said semiconductor diffused layer having a predetermined impurity concentration of a second conductivity type;
    (d) forming at least one isolation layer between said semiconductor substrate and said semiconductor epitaxial layer, said isolation layer having a predetermined impurity concentration of said first conductivity type; and,
    (e) generating a depletion region substantially underneath said semiconductor diffused layer;
    said predetermined impurity concentrations of said semiconductor substrate and said isolation layer each exceeding said predetermined impurity concentration of said semiconductor epitaxial layer by at least a factor of approximately $2\times10^3$;
    whereby the effect upon said depletion region of a micro defect present at said semiconductor substrate is minimized.

2. The method of forming a power rectifier as recited in claim 1 wherein said predetermined impurity concentration of said semiconductor epitaxial layer is at most approximately $5\times10^{15}$ cm$^{-3}$, and said predetermined impurity concentration of said isolation layer is at least approximately $1\times10^{19}$ cm$^{-3}$.

3. The method of forming a power rectifier as recited in claim 1 wherein said semiconductor substrate includes silicon.

4. The method of forming a power rectifier an recited in claim 1 wherein said first conductivity type is n type, and said second conductivity type is p type.

5. The method of forming a power rectifier as recited in claim 1 wherein said isolation layer is formed with a thickness parameter of approximately 1 micron and a resistivity parameter of approximately 5.0 ohm-cm.

6. The method of forming a power rectifier as recited in claim 1 wherein the power rectifier is characterized by a breakdown voltage exceeding 450V.

7. A method of forming a power rectifier having high breakdown voltage comprising the steps of:
    (a) establishing a semiconductor substrate having a predetermined impurity concentration of a first conductivity type, said predetermined impurity concentration of said semiconductor substrate being at least approximately $1\times10^{19}$ cm$^{-3}$;
    (b) forming a semiconductor epitaxial layer to extend over said semiconductor substrate, said semiconductor epitaxial layer having a predetermined impurity concentration of said first conductivity type, said predetermined impurity concentration of said semiconductor epitaxial layer being at most approximately $5\times10^{15}$ cm$^{-3}$;
    (c) forming by a thermal diffusion process a semiconductor diffused layer to extend over said semiconductor epitaxial layer, said semiconductor diffused layer having a predetermined impurity concentration of a second conductivity type;
    (d) forming at least one isolation layer between said semiconductor substrate and said semiconductor epitaxial layer, said isolation layer having a predetermined impurity concentration of said first conductivity type, said predetermined impurity concentration of said isolation layer being at least approximately $1\times10^{19}$ cm$^{-3}$; and,
    (e) generating a depletion region substantially underneath said semiconductor diffused layer;
    whereby the effect upon said depletion region of a micro defect present at said semiconductor substrate is minimized.

8. The method of forming a power rectifier as recited in claim 7 wherein said semiconductor substrate includes silicon.

9. The method of forming a power rectifier as recited in claim 7 wherein said first conductivity type is n type, and said second conductivity type is p type.

10. The method of forming a power rectifier as recited in claim 7 wherein said isolation layer is formed with a thickness parameter of approximately 1 micron and a resistivity parameter of approximately 5.0 ohm-cm.

11. The method of forming a power rectifier as recited in claim 7 wherein the power rectifier is characterized by a breakdown voltage exceeding 450V.

* * * * *